(12) United States Patent
Wang et al.

(10) Patent No.: US 7,777,530 B2
(45) Date of Patent: *Aug. 17, 2010

(54) COMPARATOR MODULE

(75) Inventors: Yen-Hui Wang, Hsinchu (TW);
Ching-Rong Chang, Hsin-Chu County (TW)

(73) Assignee: ILI Technology Corp., Jhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/391,269

(22) Filed: Feb. 24, 2009

(65) Prior Publication Data

US 2009/0153195 A1 Jun. 18, 2009

Related U.S. Application Data

(62) Division of application No. 11/934,792, filed on Nov. 5, 2007, now Pat. No. 7,656,217.

(51) Int. Cl.
*H03K 5/22* (2006.01)

(52) U.S. Cl. .............................. 327/63; 327/66; 327/309

(58) Field of Classification Search ................. 327/534, 327/536, 50, 63, 65–66, 67, 309, 312, 321
See application file for complete search history.

(56) References Cited

U.S. PATENT DOCUMENTS

| 5,764,086 | A | * | 6/1998 | Nagamatsu et al. | ........... 327/65 |
| 6,111,445 | A | * | 8/2000 | Zerbe et al. | ................. 327/231 |
| 6,324,084 | B1 | | 11/2001 | Fujisawa | |
| 6,441,596 | B1 | | 8/2002 | Inoue | |
| 7,446,575 | B2 | | 11/2008 | Yano | |
| 7,514,966 | B2 | * | 4/2009 | Ho | ............................. 327/66 |

FOREIGN PATENT DOCUMENTS

GB 2 015 839 A 9/1979

\* cited by examiner

*Primary Examiner*—Dinh T. Le
(74) *Attorney, Agent, or Firm*—Winston Hsu (57) ABSTRACT

A comparator module applied to a voltage level clamping circuit which can be implemented in an integrated circuit (IC) is provided. The IC includes a parasitic diode coupled between a first voltage source and a second voltage source. The voltage level clamping circuit includes a switch module and a comparator module. The comparator module has an output terminal, a first input terminal coupled to a first voltage source, and a second input terminal coupled to a second voltage source. The comparator module includes a current source module, a first voltage level adjusting circuit module, a second voltage level adjusting circuit module, and a comparing circuit module.

9 Claims, 9 Drawing Sheets

COMPARATOR MODULE

CROSS REFERENCE TO RELATED APPLICATIONS

This divisional application claims the benefit of U.S. patent application Ser. No. 11/934,792, filed on Nov. 5, 2007 and included herein by reference.

BACKGROUND OF THE INVENTION

1. Field of the Invention

The present invention relates to a comparator module, and more particularly, to a high-speed comparator module applied to a voltage level clamping circuit which can be implemented in an integrated circuit (IC).

2. Description of the Prior Art

Figure 1:
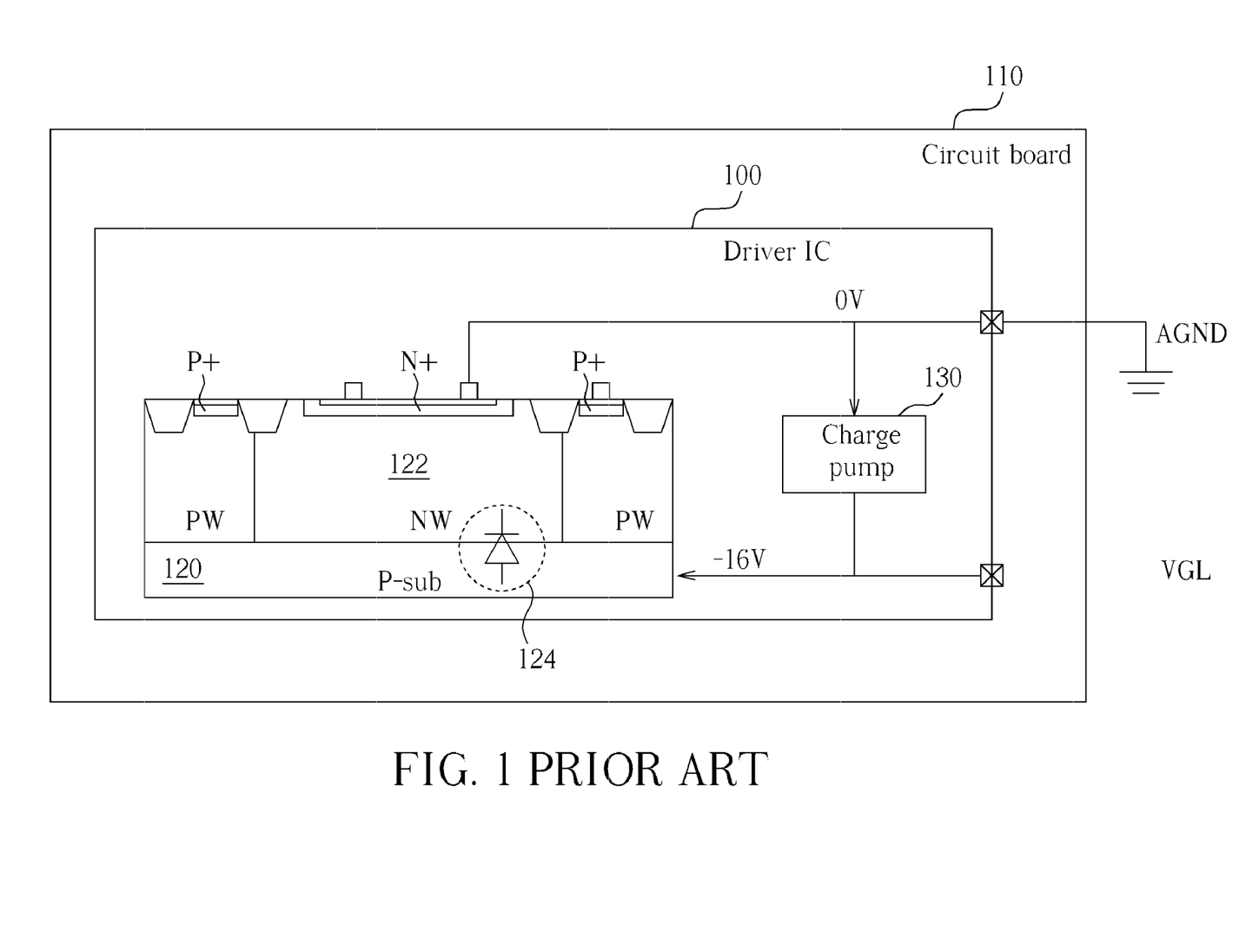
FIG. 1 shows a simplified block diagram of a conventional driver integrated circuit (IC) and a circuit board of a LCD panel in accordance with a prior art.
Figure 2:
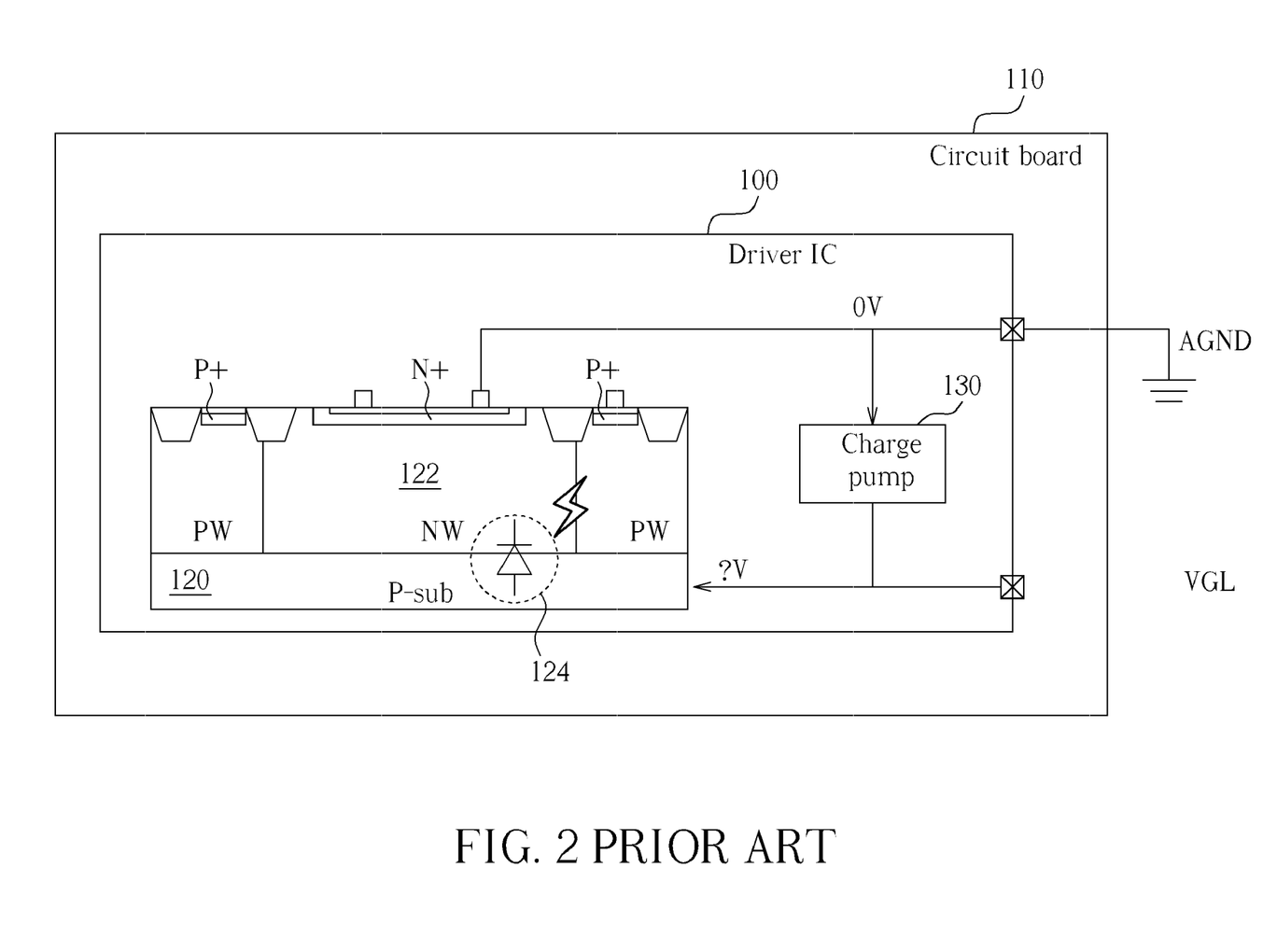
FIG. 2 shows another simplified block diagram of the conventional driver IC and the circuit board in accordance with the prior art.

Please refer to FIG. 1. FIG. 1 shows a simplified block diagram of a conventional driver integrated circuit (IC) 100 and a circuit board 110 of a LCD panel (not shown) in accordance with a prior art, wherein a voltage level of a P-type substrate 120 of the driver IC 100 is in a normal operation period. As shown in FIG. 1, in the driver IC 100, since the driver IC 100 is designed for high voltage operation, using a negative bias voltage (such as −16V) for the P-type substrate 120 is a common way to ensure that the driver IC 100 operates normally. The required negative bias voltage for the P-type substrate 120 is attained by using a charge pump 130, however, when the driver IC 100 has just started up, the required negative bias voltage for the P-type substrate 120 is not yet formed, and if an external voltage source VGL has a positive voltage at this time, the positive voltage will forward bias a parasitic diode 124 between the P-type substrate 120 and an N well 122, so as to generate a latchup effect and damage the driver IC 100. Please refer to FIG. 2. FIG. 2 shows another simplified block diagram of the conventional driver IC 100 and the circuit board 110 in accordance with the prior art, wherein the voltage level of the P-type substrate 120 of the driver IC 100 is in a start-up operation period.

Figure 3:
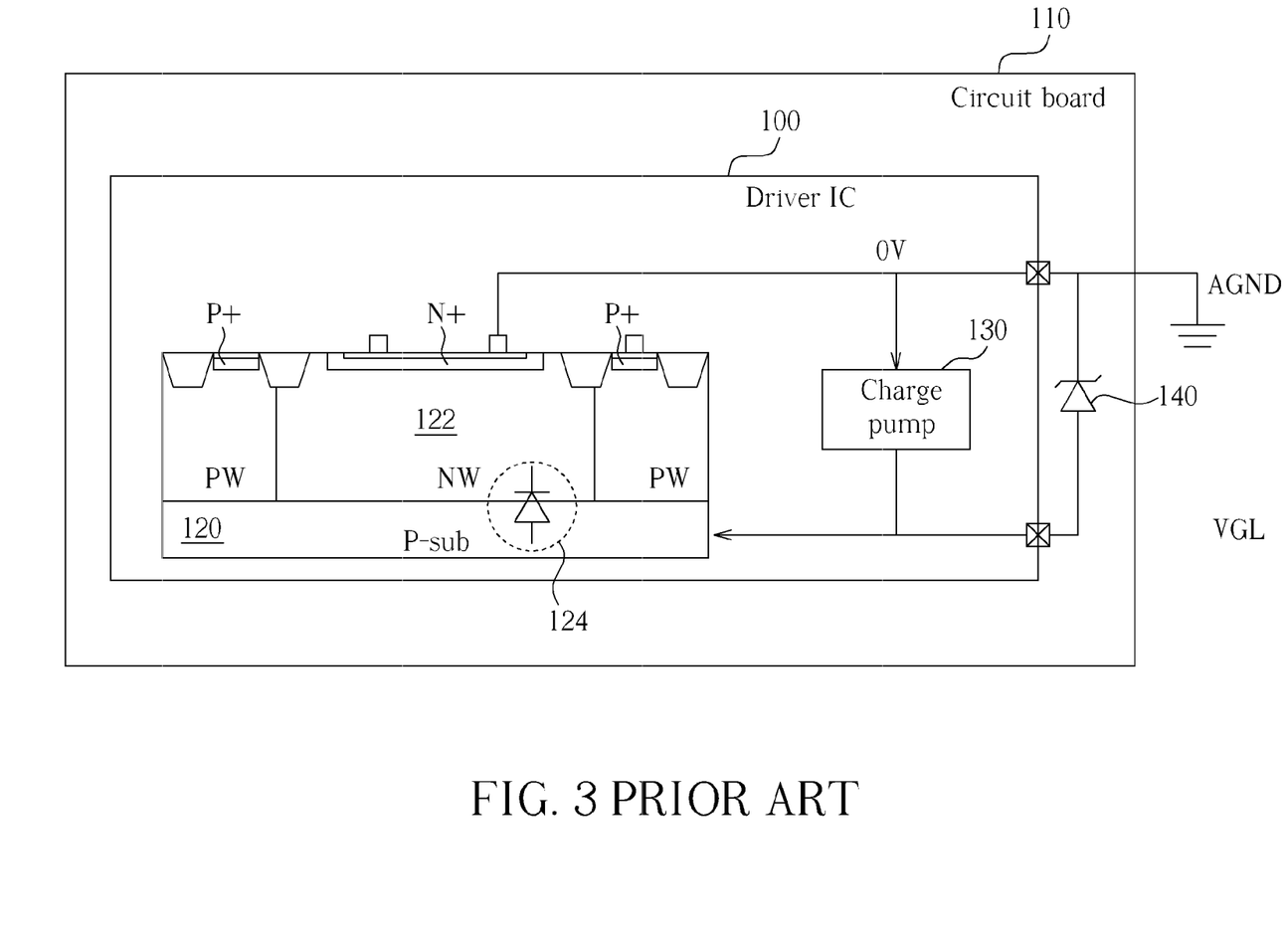
FIG. 3 shows yet another simplified block diagram of the conventional driver IC and the circuit board in accordance with the prior art.

Please refer to FIG. 3. FIG. 3 shows yet another simplified block diagram of the conventional driver IC 100 and the circuit board 110 in accordance with the prior art, wherein the prior art adds a Schottky diode 140 outside the driver IC 100 to solve the above problem. In this way, when the voltage level of the external voltage source VGL is greater than 0.3V (i.e., when a ground voltage source AGND is lower than the external voltage source VGL), the Schottky diode 140 will conducted and then the voltage level of the external voltage source VGL will be clamped, so as to prevent the latchup problem generated by forward biasing the parasitic diode 124 between the P-type substrate 120 and N well 122 in the driver IC 100. There will be a high product cost problem with this kind of conventional circuit scheme, however, since it requires additional external elements to be implemented.

SUMMARY OF THE INVENTION

It is therefore one of the objectives of the present invention to provide a comparator module applied to a voltage level clamping circuit which can be implemented in an integrated circuit (IC), so as to solve the above problem.

In accordance with an embodiment of the present invention, a comparator module is disclosed. The comparator module has an output terminal, a first input terminal coupled to a first voltage source, and a second input terminal coupled to a second voltage source. The comparator module includes a current source module, a first voltage level adjusting circuit module, a second voltage level adjusting circuit module, and a comparing circuit module. The current source module is coupled to a third voltage source, and is utilized for generating a bias current. The first voltage level adjusting circuit module is coupled between the current source module and the first voltage source, and is utilized for receiving the bias current and detecting a first input signal of the first voltage source to generate a third input signal. The second voltage level adjusting circuit module is coupled between the current source module and the second voltage source, and is utilized for receiving the bias current and detecting a second input signal of the second voltage source to generate a fourth input signal. The comparing circuit module is coupled between the first voltage level adjusting circuit module, the second voltage level adjusting circuit module, the first voltage source, the second voltage source, and the third voltage source, for receiving the third input signal and the fourth input signal to generate the output signal. In addition, the comparing circuit module includes a first switch module and a second switch module. The first switch module is coupled to the third voltage source, and is utilized for selectively letting the third voltage source coupled to a first node or a second node, wherein the first node is coupled to the output terminal. The second switch module is coupled between the first node, the second node, the first voltage level adjusting circuit module, the second voltage level adjusting circuit module, the first voltage source, and the second voltage source. In addition, the second switch module includes a first switch element and a second switch element. The first switch element has a control terminal coupled to the first voltage level adjusting circuit module, a first terminal coupled to the second voltage source, and a second terminal coupled to the first node, and the first switch element is utilized for receiving the third input signal. The second switch element has a control terminal coupled to the second voltage level adjusting circuit module, a first terminal coupled to the first voltage source, and a second terminal coupled to the second node, and the second switch element is utilized for receiving the fourth input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . ." The terms "couple" and "coupled" are intended to mean either an indirect or a direct electrical connection. Thus, if a first device couples to a second device, that connection may be through a direct electrical connection, or through an indirect electrical connection via other devices and connections.

The present invention relates to a voltage level clamping circuit that can be implemented in an integrated circuit (IC) and a high-speed comparator module. This document will illustrate several exemplary embodiments that apply the voltage level clamping circuit and the comparator module in the present invention. A person of average skill in the pertinent art should, however, be able to understand that the voltage level clamping circuit and the comparator module of the present invention also can be applied to other similar types of ICs and are not limited to the particular embodiments described in the following paragraphs or to the particular manner in which any features of such embodiments are implemented.

In general, the voltage level clamping circuit and the comparator module of the present invention can be applied to all kinds of ICs. By way of example but not limitation, a voltage level clamping circuit and a comparator module applied to a driver IC of a LCD panel is disclosed in accordance with the present invention. In addition, under a condition of not affecting the technical disclosure of the present invention, the driver IC of the LCD panel will be used as an example to illustrate the details of the circuit configuration and the operational scheme of the voltage level clamping circuit and the comparator module in the present invention.

Figure 4:
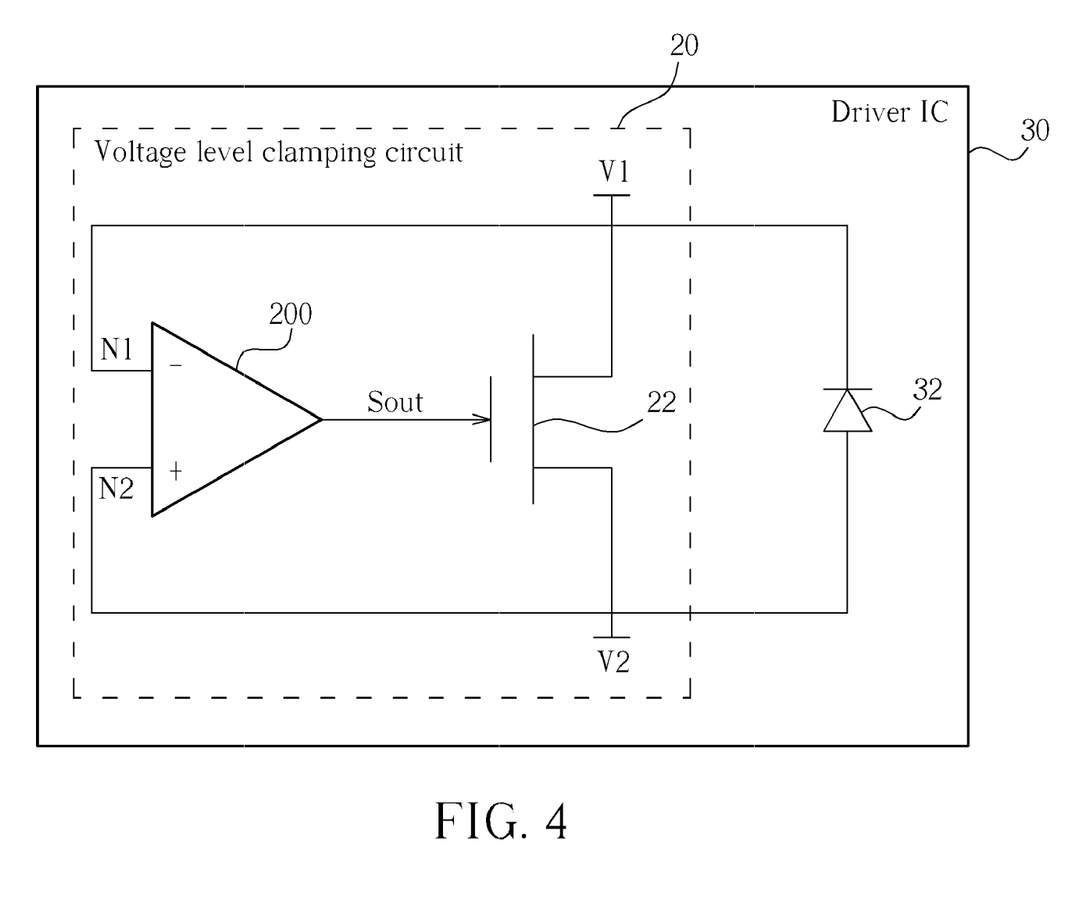
FIG. 4 shows a simplified block diagram of a voltage level clamping circuit in accordance with a first embodiment of the present invention

Please refer to FIG. 4. FIG. 4 shows a simplified block diagram of a voltage level clamping circuit 20 in accordance with a first embodiment of the present invention, where the voltage level clamping circuit 20 is implemented in a driver IC 30 of a LCD panel (not shown), and the driver IC 30 includes a parasitic diode 32 coupled between a first voltage source V1 (such as a ground voltage source AGND shown in FIG. 1) and a second voltage source V2 (such as a external voltage source VGL shown in FIG. 1). A voltage level of the second voltage source V2 is not fixed to a predetermined voltage value during a start-up operation period of the driver IC 30. As shown in FIG. 4, the voltage level clamping circuit 20 includes a switch module 22 and a comparator module 200. The switch module 22 is coupled between the first voltage source V1 and the second voltage source V2, and the switch module 22 is connected to the parasitic diode 32 in parallel. The comparator module 200 has an output terminal coupled to the switch module 22, a first input terminal N1 coupled to the first voltage source V1, and a second input terminal N2 coupled to the second voltage source V2, and the comparator module 200 is utilized for comparing a voltage level of the first voltage source V1 with the voltage level of the second voltage source V2 to generate an output signal Sout, and transmitting the output signal to the switch module 22 to control a conducting state of the switch module 22 to selectively clamp the voltage level of the second voltage source V2. When the voltage level of the first voltage source V1 is lower than the voltage level of the second voltage source V2, the comparator module 200 will generate the output signal Sout to conduct the switch module 22 to clamp the voltage level of the second voltage source V2, and when the voltage level of the first voltage source V1 is not lower than the voltage level of the second voltage source V2, the comparator module 200 will generate the output signal Sout to not conduct the switch module 22. Please note, however, that the above embodiment is only for an illustrative purpose and is not meant to be a limitation of the present invention. In other embodiments of the present invention, for example, the voltage level clamping circuit 20 also can be designed as follows: when the voltage level of the first voltage source V1 is higher than the voltage level of the second voltage source V2, the comparator module 200 will generate the output signal Sout to conduct the switch module 22 to clamp the voltage level of the second voltage source V2, and when the voltage level of the first voltage source V1 is not higher than the voltage level of the second voltage source V2, the comparator module 200 will generate the output signal Sout to not conduct the switch module 22. In any case, various modifications and alterations of the device and method should fall into the disclosed scope of the present invention as long as the performances and functions of the voltage level clamping circuit (which can be implemented in an IC) disclosed by the present invention can be attained.

Figure 5:
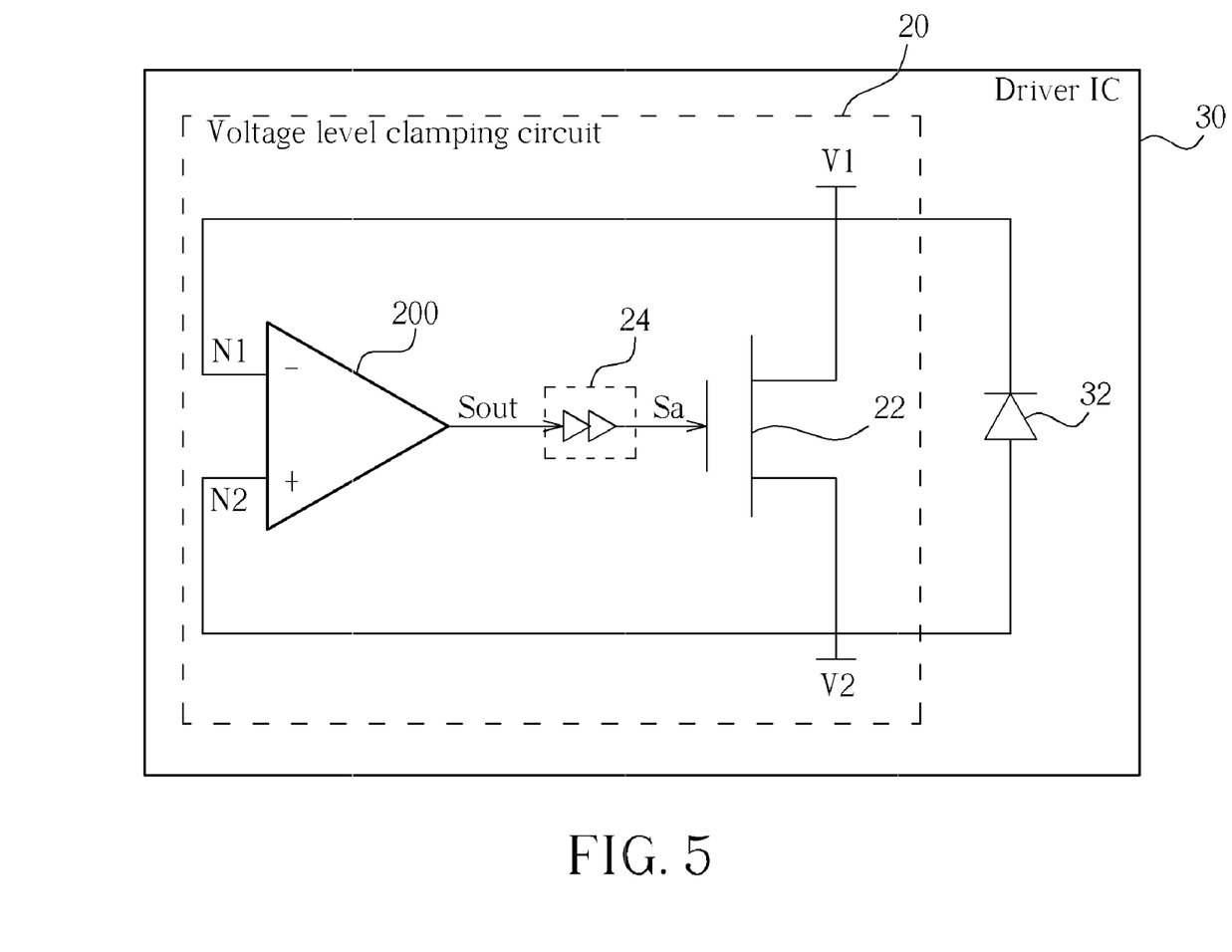
FIG. 5 shows a simplified block diagram of a voltage level clamping circuit in accordance with the second embodiment of the present invention.

In addition, the voltage level clamping circuit 20 can further include a buffer amplifier module 24 in a second embodiment of the present invention. Please refer to FIG. 5. FIG. 5 shows a simplified block diagram of a voltage level clamping circuit 20 in accordance with the second embodiment of the present invention. As shown in FIG. 5, the buffer amplifier module 24 is coupled between the comparator module 200 and the switch module 22, for amplifying the output signal Sout to generate an amplified output signal Sa, and for transmitting the amplified output signal Sa to the switch module 22. Please note, however, that the above embodiment is only for an illustrative purpose and is not meant to be a limitation of the present invention. Next, this document will illustrate the comparator module 200 in the voltage level clamping circuit 20 of the first embodiment and the second embodiment in the present invention.

Figure 6:
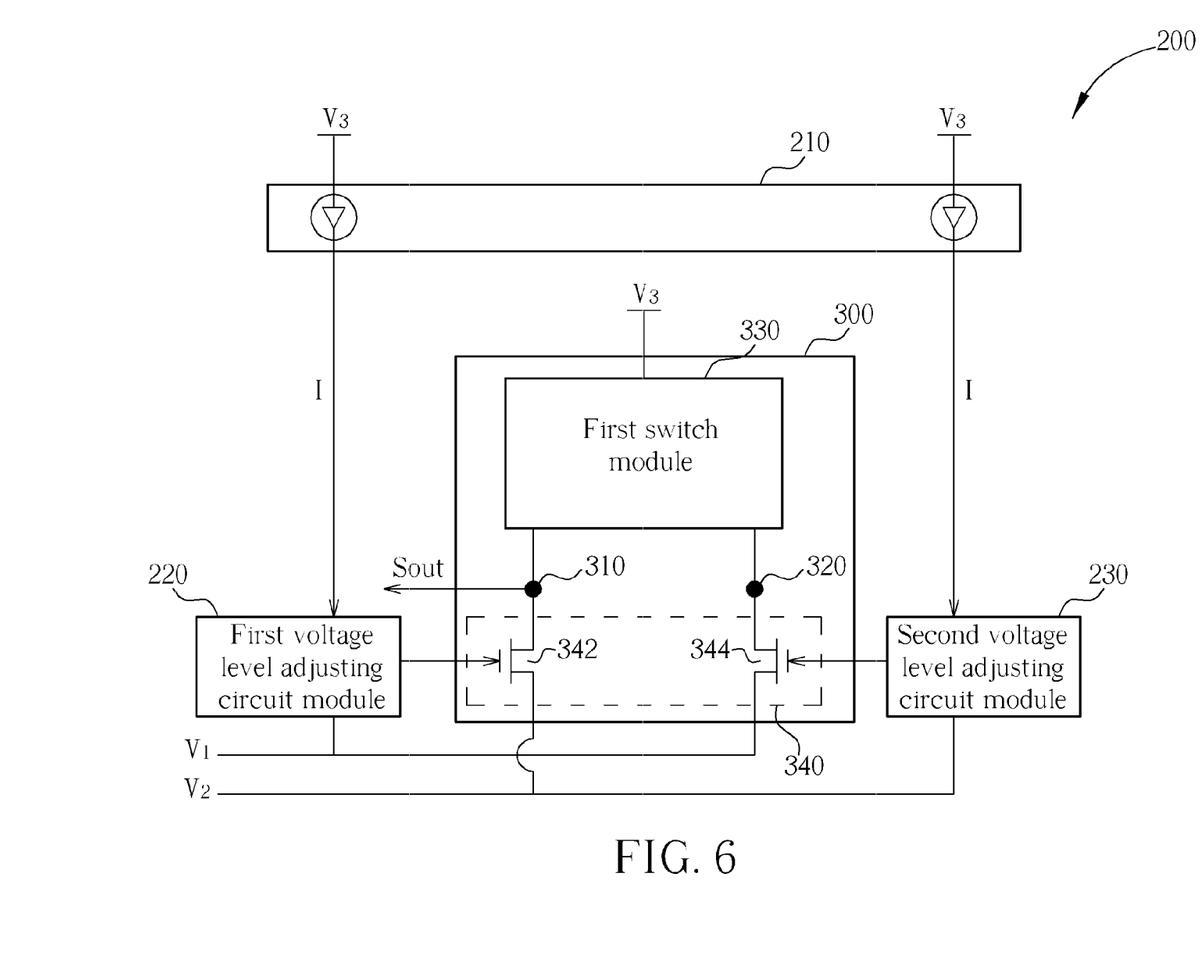
FIG. 6 shows a simplified block diagram of a comparator module in the voltage level clamping circuit in accordance with the first embodiment and the second embodiment of the present invention.

Please refer to FIG. 6. FIG. 6 shows a simplified block diagram of a comparator module 200 in the voltage level clamping circuit 20 in accordance with the first embodiment and the second embodiment of the present invention. As shown in FIG. 6, the comparator module 200 includes a current source module 210, a first voltage level adjusting circuit module 220, a second voltage level adjusting circuit module 230, and a comparing circuit module 300. The current source module 210 is coupled to a third voltage source V3, and is utilized for generating a bias current I. The first voltage level adjusting circuit module 220 is coupled between the current source module 210 and the first voltage source V1, and is utilized for receiving the bias current I and detecting a first input signal S1 of the first voltage source V1 to generate a third input signal S3. The second voltage level adjusting circuit module 230 is coupled between the current source module 210 and the second voltage source V2, and is utilized for receiving the bias current I and detecting a second input signal S2 of the second voltage source V2 to generate a fourth input signal S4. The comparing circuit module 300 is coupled between the first voltage level adjusting circuit module 220, the second voltage level adjusting circuit module 230, the first voltage source V1, the second voltage source V2, and the third voltage source V3, for receiving the third input signal S3 and the fourth input signal S4 to generate an output signal Sout.

In addition, the comparing circuit module 300 further includes a first switch module 330 and a second switch module 340. The first switch module 330 is coupled to the third voltage source V3, and is utilized for selectively coupling the third voltage source V3 to a first node 310 or a second node 320, wherein the first node 310 is coupled to the output terminal. The second switch module 340 is coupled between the first node 310, the second node 320, the first voltage level adjusting circuit module 220, the second voltage level adjusting circuit module 230, the first voltage source V1, and the second voltage source V2. The second switch module 340 further includes a first switch element 342 and a second switch element 344. In this embodiment, the first switch element 342 and the second switch element 344 both are N-type FETs (such as NMOSFETs). The first switch element 342 has a control terminal (i.e., a gate terminal) coupled to the first voltage level adjusting circuit module 220, a first terminal (i.e., a source terminal) coupled to the second voltage source V2, and a second terminal (i.e., a drain terminal) coupled to the first node 310, and the first switch element 342 is utilized for receiving the third input signal S3. The second switch element 344 has a control terminal (i.e., a gate terminal) coupled to the second voltage level adjusting circuit module 230, a first terminal (i.e., a source terminal) coupled to the first voltage source V1, and a second terminal (i.e., a drain terminal) coupled to the second node 320, and the second switch element 344 is utilized for receiving the fourth input signal S4. Please note that the above embodiment is only for an illustrative purpose and is not meant to be a limitation of the present invention. For example, the first switch element 342 and the second switch element 344 also can both be P-type FETs (such as PMOSFETs). Next, this document illustrates details of the circuit configuration and the operational scheme of the comparator module 200 in the present invention.

Figure 7:
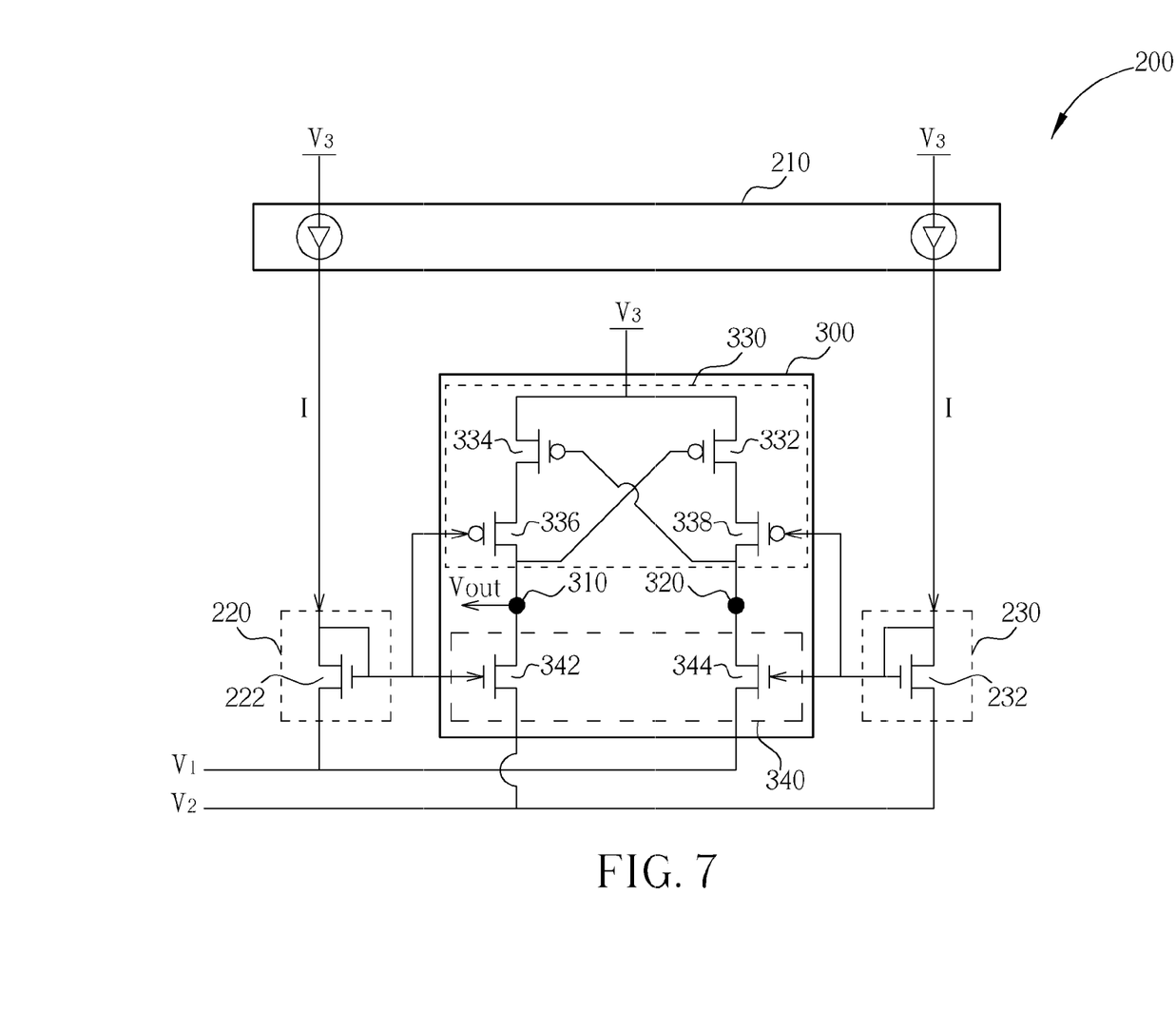
FIG. 7 shows a simplified circuit configuration diagram of the comparator module shown in FIG. 6 in accordance with a first embodiment of the comparator module of the present invention.
Figure 9:
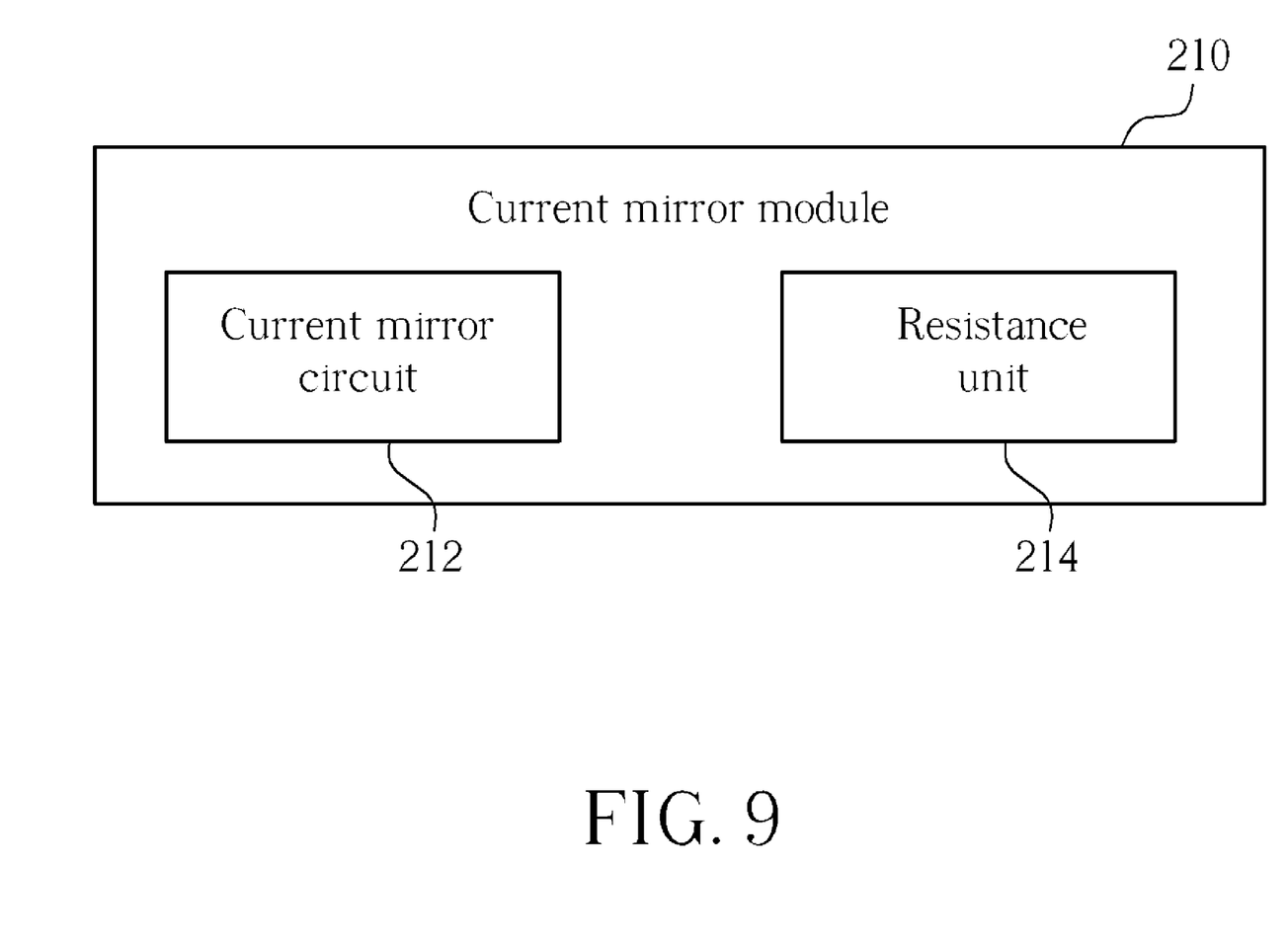
FIG. 9 is a diagram of an exemplary implementation of the current source module shown in FIG. 7.

Please refer to FIG. 7. FIG. 7 shows a simplified circuit configuration diagram of the comparator module 200 shown in FIG. 6 in accordance with a first embodiment of the comparator module 200 of the present invention. As shown in FIG. 7, the first voltage level adjusting circuit module 220 includes a third switch element 222 and the second voltage level adjusting circuit module 230 includes a fourth switch element 232. The first switch module 330 is further coupled between the first voltage level adjusting circuit module 220 and the second voltage level adjusting circuit module 230, and the first switch module includes a fifth switch element 332, a sixth switch element 334, a seventh switch element 336, and an eighth switch element 338. In addition, in this embodiment, the first switch element 342, the second switch element 344, the third switch element 222, and the fourth switch element 232 all are N-type FETs (such as NMOSFETs), and the fifth switch element 332, the sixth switch element 334, the seventh switch element 336, and the eighth switch element 338 all are P-type FETs (such as PMOSFETs). The third switch element 222 has a control terminal (i.e., a gate terminal) coupled to the control terminal of the first switch element 342, a first terminal (i.e., a source terminal) coupled to the first voltage source V1, and a second terminal (i.e., a drain terminal) coupled to the current source module 210 and the control terminal of the third switch element 222. The fourth switch element 232 has a control terminal (i.e., a gate terminal) coupled to the control terminal of the second switch element 344, a first terminal (i.e., a source terminal) coupled to the second voltage source V2, and a second terminal (i.e., a drain terminal) coupled to the current source module 210 and the control terminal of the fourth switch element 232. The fifth switch element 332 has a control terminal (i.e., a gate terminal) coupled to the first node 310, a first terminal (i.e., a source terminal) coupled to the third voltage source V3, and a second terminal (i.e., a drain terminal) coupled to a first terminal of the eighth switch element 338. The sixth switch element 334 has a control terminal (i.e., a gate terminal) coupled to the second node 320, a first terminal (i.e., a source terminal) coupled to the third voltage source V3, and a second terminal (i.e., a drain terminal) coupled to a first terminal of the seventh switch element 336. The seventh switch element 336 has a control terminal (i.e., a gate terminal) coupled to the first voltage level adjusting circuit module 220, a first terminal (i.e., a source terminal) coupled to the second terminal of the sixth switch element 334, and a second terminal (i.e., a drain terminal) coupled to the first node 310. The eighth switch element 338 has a control terminal (i.e., a gate terminal) coupled to the second voltage level adjusting circuit module 230, a first terminal (i.e., a source terminal) coupled to the second terminal of the fifth switch element 332, and a second terminal (i.e., a drain terminal) coupled to the second node 320. In addition, the current source module 210 can include a current mirror circuit 212 and a resistance unit 214, as shown in FIG. 9. Since the operational details and configuration details related to utilizing the current mirror circuit and the resistance unit to realize a current source module are well known to those of average skill in this art, however, further explanation of the details and operations are omitted herein for the sake of brevity.

Please note that the above embodiment is only for an illustrative purpose and is not meant to be a limitation of the present invention. For example, the first switch element 342, the second switch element 344, the third switch element 222, and the fourth switch element 232 all can be replaced by P-type FETs (such as PMOSFETs), and the fifth switch element 332, the sixth switch element 334, the seventh switch element 336, and the eighth switch element 338 all can be replaced by N-type FETs (such as NMOSFETs). In any case, various modifications and alterations of the device and method should fall into the disclosed scope of the present invention as long as the performances and functions of the high-speed comparator module disclosed by the present invention can be attained.

Figure 8:
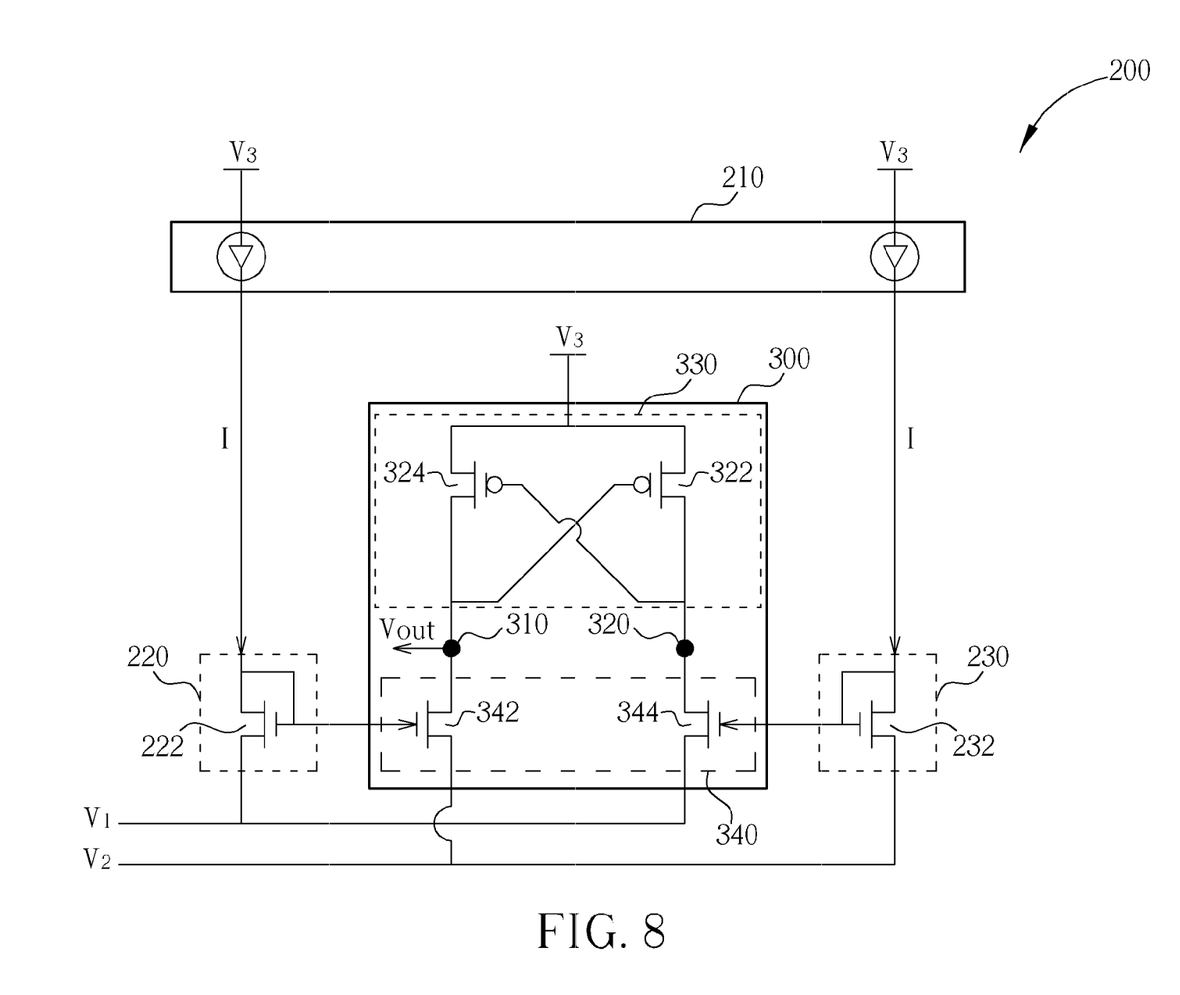
FIG. 8 shows a simplified circuit configuration diagram of the comparator module shown in FIG. 6 in accordance with a second embodiment of the comparator module of the present invention.

Please refer to FIG. 8. FIG. 8 shows a simplified circuit configuration diagram of the comparator module 200 shown in FIG. 6 in accordance with a second embodiment of the comparator module 200 of the present invention. As shown in FIG. 8, since all the circuit elements except those in the first switch module 330 of the second embodiment of the comparator module 200 are the same as those of the first embodiment of the comparator module 200, further explanation of the details and operations of the same circuit elements are omitted herein for the sake of brevity. The first switch module 330 includes a fifth switch element 322 and a sixth switch element 324. In addition, in this embodiment, the first switch element 342, the second switch element 344, the third switch element 222, and the fourth switch element 232 all are N-type FETs (such as NMOSFETs), and the fifth switch element 322 and the sixth switch element 324 both are P-type FETs (such as PMOSFETs). The fifth switch element 322 has a control terminal (i.e., a gate terminal) coupled to the first node 310, a first terminal (i.e., a source terminal) coupled to the third voltage source V3, and a second terminal (i.e., a drain terminal) coupled to the second node 320. The sixth switch element 324 has a control terminal (i.e., a gate terminal) coupled to the second node 320, a first terminal (i.e., a source terminal) coupled to the third voltage source V3, and a second terminal (i.e., a drain terminal) coupled to the first node 310.

Please note that the above embodiment is also only for an illustrative purpose, however, and is not meant to be a limitation of the present invention. For example, the first switch element 342, the second switch element 344, the third switch element 222, and the fourth switch element 232 all can be replaced by P-type FETs (such as PMOSFETs), and the fifth switch element 322 and the sixth switch element 324 both can be replaced by N-type FETs (such as NMOSFETs). Various modifications and alterations of the device and method fall into the disclosed scope of the present invention as long as the performances and functions of the high-speed comparator module disclosed by the present invention can be attained.

Briefly summarized, the voltage level clamping circuit disclosed by the present invention can be implemented in an IC, and thus a number of external elements of the IC can be reduced. In the meantime, the voltage level clamping circuit disclosed by the present invention can solve the latchup problem in the IC to prevent from damaging the IC. For example, the voltage level clamping circuit can solve the latchup problem generated by a forward biasing parasitic diode between P-type substrate and N well in the IC, so as to prevent damaging the IC. Thus, the voltage level clamping circuit disclosed by the present invention can reduce a product cost of the IC and also benefit the IC. In addition, in the high-speed comparator module 200 disclosed by the present invention, since the first terminals (i.e., the source terminals) of the first switch element 342 and the second switch element 344 are respectively coupled to the second voltage source V2 and the first voltage source V1 (unlike a conventional comparator module which couples the source terminals of the first switch element 342 and the second switch element 344 to the same first voltage source V1), a voltage variation of the first switch element and the second switch element 344 will be two times greater than that of the conventional comparator module in this way. Thus, the operation speed of the high-speed comparator module 200 disclosed by the present invention will be obviously higher than the operation speed of the conventional comparator module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A comparator module, having an output terminal, a first input terminal coupled to a first voltage source, and a second input terminal coupled to a second voltage source, the comparator module comprising:

a current source module, coupled to a third voltage source, for generating a bias current;

a first voltage level adjusting circuit module, coupled between the current source module and the first voltage source, for receiving the bias current and detecting a first input signal of the first voltage source to generate a third input signal;

a second voltage level adjusting circuit module, coupled between the current source module and the second voltage source, for receiving the bias current and detecting a second input signal of the second voltage source to generate a fourth input signal; and a comparing circuit module, coupled between the first voltage level adjusting circuit module, the second voltage level adjusting circuit module, the first voltage source, the second voltage source, and the third voltage source, for receiving the third input signal and the fourth input signal to generate an output signal, the comparing circuit module comprising:

a first switch module, for coupling the third voltage source to a first node or a second node, wherein the first node is coupled to the output terminal; and a second switch module, coupled between the first node, the second node, the first voltage level adjusting circuit module, the second voltage level adjusting circuit module, the first voltage source, and the second voltage source, the second switch module comprising:

a first switch element, having a control terminal coupled to the first voltage level adjusting circuit module, a first terminal coupled to the second voltage source, and a second terminal coupled to the first node, the first switch element being utilized for receiving the third input signal; and a second switch element, having a control terminal coupled to the second voltage level adjusting circuit module, a first terminal coupled to the first voltage source, and a second terminal coupled to the second node, the second switch element being utilized for receiving the fourth input signal.

2. The comparator module of claim 1, wherein the first voltage level adjusting circuit module comprises:

a third switch element, having a control terminal coupled to the control terminal of the first switch element, a first terminal coupled to the first voltage source, and a second terminal coupled to the current source module and the control terminal of the third switch element; and the second voltage level adjusting circuit module comprises:

a fourth switch element, having a control terminal coupled to the control terminal of the second switch element, a first terminal coupled to the second voltage source, and a second terminal coupled to the current source module and the control terminal of the fourth switch element.

3. The comparator module of claim 1, wherein the first switch module is further coupled between the first voltage level adjusting circuit module and the second voltage level adjusting circuit module, and the first switch module comprises:

a fifth switch element, having a control terminal coupled to the first node, a first terminal coupled to the third voltage source, and a second terminal;

a sixth switch element, having a control terminal coupled to the second node, a first terminal coupled to the third voltage source, and a second terminal;

a seventh switch element, having a control terminal coupled to the first voltage level adjusting circuit module, a first terminal coupled to the second terminal of the sixth switch element, and a second terminal coupled to the first node; and an eighth switch element, having a control terminal coupled to the second voltage level adjusting circuit module, a first terminal coupled to the second terminal of the fifth switch element, and a second terminal coupled to the second node.

4. The comparator module of claim 3, wherein the first switch element, the second switch element, the third switch element, the fourth switch element, the fifth switch element, the sixth switch element, the seventh switch element, and the eighth switch element all are transistors.

5. The comparator module of claim 4, wherein the first switch element, the second switch element, the third switch element, and the fourth switch element all are N-type FETs, and the fifth switch element, the sixth switch element, the seventh switch element, and the eighth switch element all are P-type FETs.

6. The comparator module of claim 1, wherein the first switch module comprises:

a fifth switch element, having a control terminal coupled to the first node, a first terminal coupled to the third voltage source, and a second terminal coupled to the second node; and a sixth switch element, having a control terminal coupled to the second node, a first terminal coupled to the third voltage source, and a second terminal coupled to the first node.

7. The comparator module of claim 6, wherein the first switch element, the second switch element, the third switch element, the fourth switch element, the fifth switch element, and the sixth switch element all are transistors.

8. The comparator module of claim 7, wherein the first switch element, the second switch element, the third switch element, and the fourth switch element all are N-type FETs, and the fifth switch element and the sixth switch element both are P-type FETs.

9. The comparator module of claim 1, wherein the current source module comprises a current mirror circuit and a resistance unit.

* * * * *